(12) United States Patent
Bidermann et al.

(10) Patent No.: US 7,291,507 B2
(45) Date of Patent: Nov. 6, 2007

(54) USING A TIME INVARIANT STATISTICAL PROCESS VARIABLE OF A SEMICONDUCTOR CHIP AS THE CHIP IDENTIFIER

(75) Inventors: William R. Bidermann, Los Gatos, CA (US); Michael Frank, Sunnyvale, CA (US)

(73) Assignee: PIXIM, Inc., Mountain View, CA (US)

( * ) Notice: Subject to any disclaimer, the term of this patent is extended or adjusted under 35 U.S.C. 154(b) by 503 days.

(21) Appl. No.: 10/950,001

(22) Filed: Sep. 23, 2004

(65) Prior Publication Data

US 2006/0063286 A1    Mar. 23, 2006

(51) Int. Cl.
    *G01R 31/26* (2006.01)
(52) U.S. Cl. .............................. 438/14; 438/17; 438/18; 257/48; 257/E23.179
(58) Field of Classification Search .................. 438/14, 438/17, 18; 257/48, E23.179
    See application file for complete search history.

(56) References Cited

U.S. PATENT DOCUMENTS

| | | | | |
|---|---|---|---|---|
| 5,984,190 | A * | 11/1999 | Nevill | 235/492 |
| 6,667,468 | B2 * | 12/2003 | Kurosawa et al. | 250/208.1 |
| 6,759,863 | B2 * | 7/2004 | Moore | 324/765 |
| 7,102,672 | B1 * | 9/2006 | Jacobs | 348/243 |
| 7,157,794 | B2 * | 1/2007 | Mori | 257/728 |
| 2001/0036305 | A1 * | 11/2001 | Jun | 382/149 |
| 2004/0017224 | A1 * | 1/2004 | Tumer et al. | 327/51 |
| 2004/0064767 | A1 * | 4/2004 | Huckaby et al. | 714/710 |
| 2005/0128325 | A1 * | 6/2005 | Fraenkel et al. | 348/308 |

* cited by examiner

*Primary Examiner*—Michael Lebentritt
*Assistant Examiner*—Abdulfattah Mustapha
(74) *Attorney, Agent, or Firm*—Patent Law Group LLP; Carmen C. Cook

(57) ABSTRACT

A method for providing an identifier for a semiconductor chip after the manufacture of the semiconductor chip using a fabrication process includes selecting one or more circuit elements formed on the semiconductor chip where each of the circuit elements having an electrical parameter that has a time-invariant statistical process variation, measuring data values of the electrical parameter of the one or more circuit elements, processing the data values, and deriving the identifier for the semiconductor chip using the processed data values. The identifier identifies the semiconductor chip from other semiconductor chips manufactured using the fabrication process. The circuit elements can be selected from the group of bipolar transistors, MOS transistors, light detecting pixel elements, and memory cells. The chip identification method is particularly useful for identifying image sensor chips where the dark current values or the defective pixel locations can be used as the chip identifier.

26 Claims, 3 Drawing Sheets

Sensor A

Sensor B

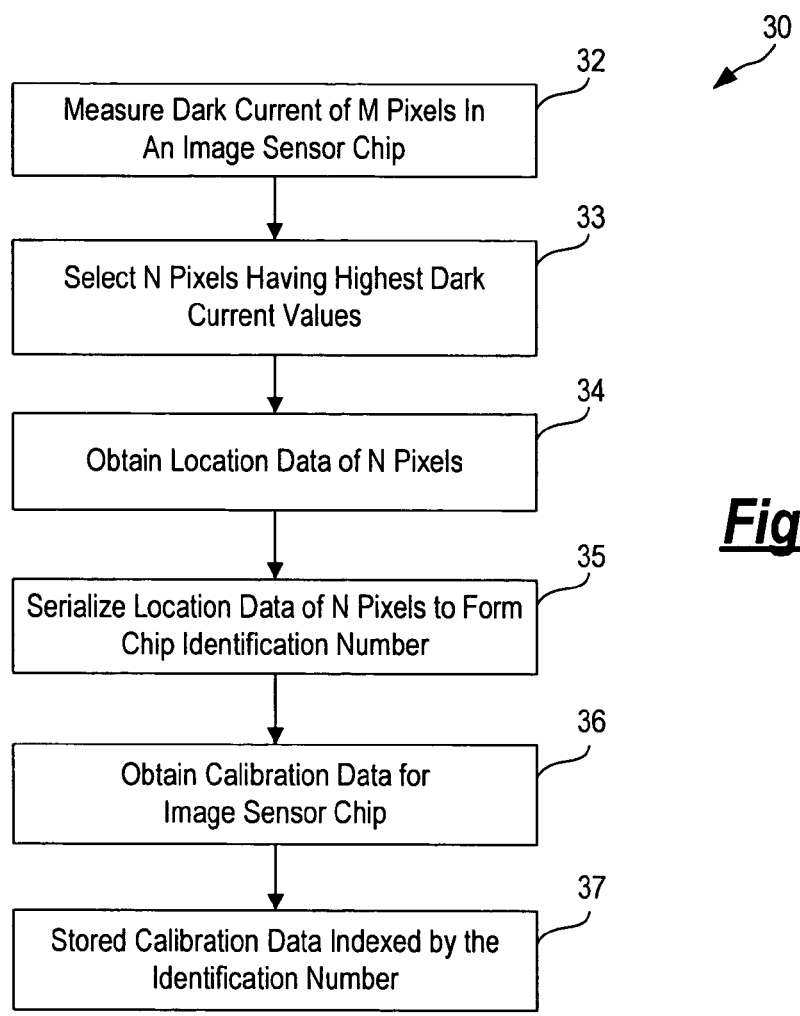
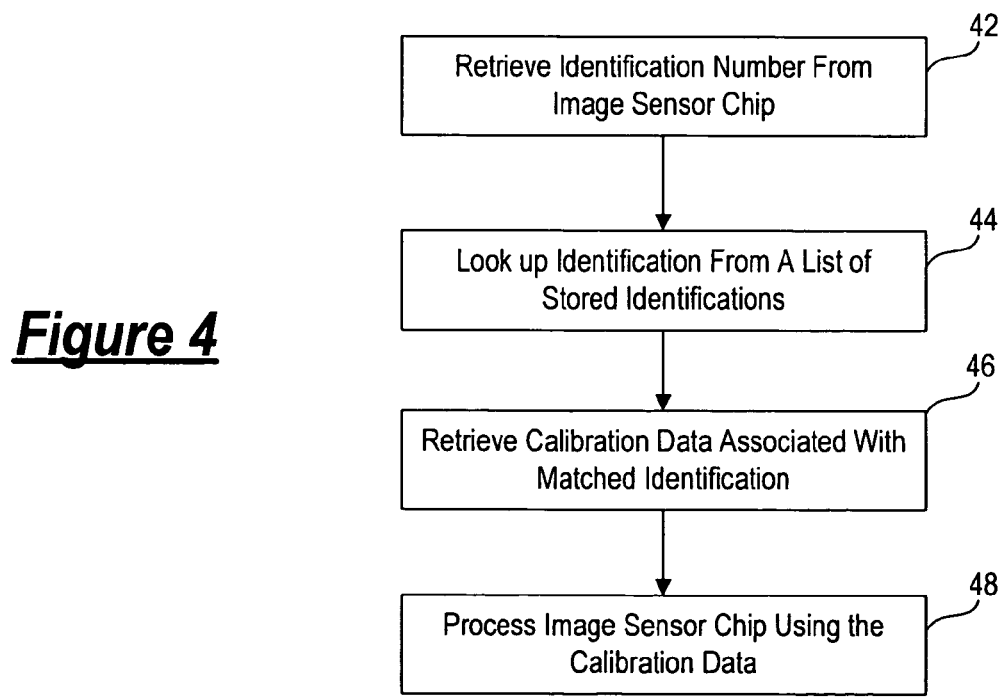

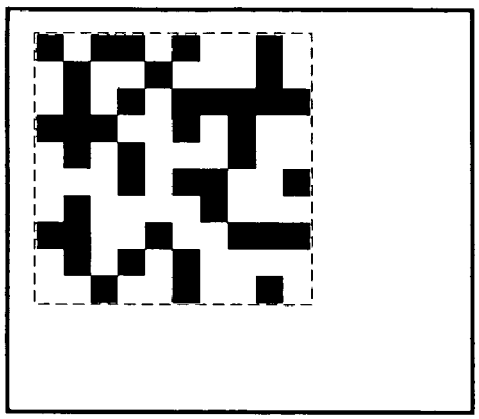 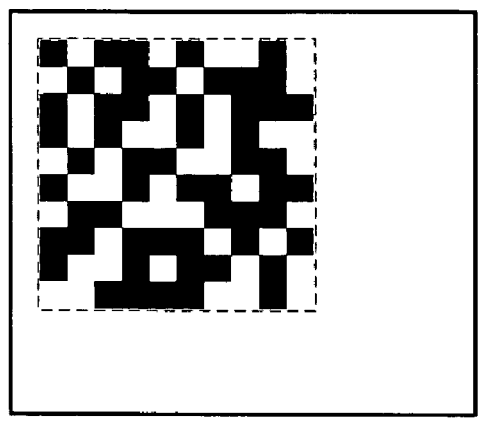
*Figure 5*

_US 7,291,507 B2_

USING A TIME INVARIANT STATISTICAL PROCESS VARIABLE OF A SEMICONDUCTOR CHIP AS THE CHIP IDENTIFIER

FIELD OF THE INVENTION

The invention relates to a semiconductor chip identifier or a method for providing identification for a semiconductor chip and, in particular, to a method of using an electrical parameter that is or is based on a time-invariant statistical process variable of the semiconductor chip as the chip identifier.

DESCRIPTION OF THE RELATED ART

In the manufacturing of semiconductor integrated circuits (also referred to as semiconductor chips) and in the incorporation of semiconductor chips into electronic systems, it is often necessary to provide identification for each chip. The identifier (ID) may be unique for each chip or for a group of chips. The identifier may be used to associate each chip with a set of repair data for that chip. The repair data can be used to enable repairing of a specific defect in the chip. The ability to associate repair data with an individual semiconductor chip is particularly useful for memory bit repair/replacement in a memory device or defective pixel repair in a CMOS or CCD image sensor. Alternately, chip identification capability can be used to enable (or disable as appropriate) certain features in the software associated with the electronics system in which the semiconductor chip is installed. For example, a microprocessor chip could be identified as licensed to run a particular operating system or application program and other chips of the same type, not identified as such, would be considered as not capable of supporting that functionality.

Methods for providing identification for semiconductor chips are known and generally require some form of physical alteration of the chips to incorporate the identification number. The prevailing method for identifying a specific chip is accomplished by blowing fuses formed on the chip. The fuses can be blown either with a laser or electrically. Using fuses for identification requires either more complicated processing steps, such as additional fuse layers, or additional programming steps to blow the fuses. Adding and programming fuses add to the cost of manufacturing the semiconductor chip. A more cost effective method for providing chip identification is desired.

SUMMARY OF THE INVENTION

According to one embodiment of the present invention, a method for providing an identifier for a semiconductor chip after the manufacture of the semiconductor chip using a fabrication process includes selecting one or more circuit elements formed on the semiconductor chip where each of the circuit elements having an electrical parameter that has a time-invariant statistical process variation, measuring data values of the electrical parameter of the one or more circuit elements, processing the data values, and deriving the identifier for the semiconductor chip using the processed data values. The identifier identifies the semiconductor chip from other semiconductor chips manufactured using the fabrication process.

In one embodiment, selecting one or more circuit elements formed on the semiconductor chip includes selecting one or more circuit elements from the group of bipolar transistors, MOS transistors, light detecting pixel elements, memory cells, resistors, capacitors and inductors.

The method of the present invention can be advantageously applied to provide unique identification for image sensor chips. According to one embodiment of the present invention, a method for providing an identifier for an image sensor semiconductor chip including an array of pixels after the manufacture of the image sensor semiconductor chip using a fabrication process includes measuring dark current values of each pixel in the array of pixels, selecting N pixels from the array of pixels having the N highest dark current values, obtaining the locations of the N pixels in the array of pixels, serializing the location values of the N pixels into a bit string, and providing the bit string as the identifier for the image sensor semiconductor chip.

In an alternate embodiment, the N highest dark current values are digitized into k-bit digital values and the k-bit digital values are serialized to form the identifier for the image sensor semiconductor-chip.

The present invention is better understood upon consideration of the detailed description below and the accompanying drawings.

BRIEF DESCRIPTION OF THE DRAWINGS

FIG. 3 illustrates a chip identification method for an image sensor chip according to one embodiment of the present invention.

FIG. 4 illustrates the steps that can be taken at the camera assembly stage for retrieving the stored calibration data associated with an image sensor chip.

FIG. 5 illustrates pixel patterns for two image sensors for illustrating the random nature of the dark current values.

DETAILED DESCRIPTION OF THE PREFERRED EMBODIMENTS

Figure 1:
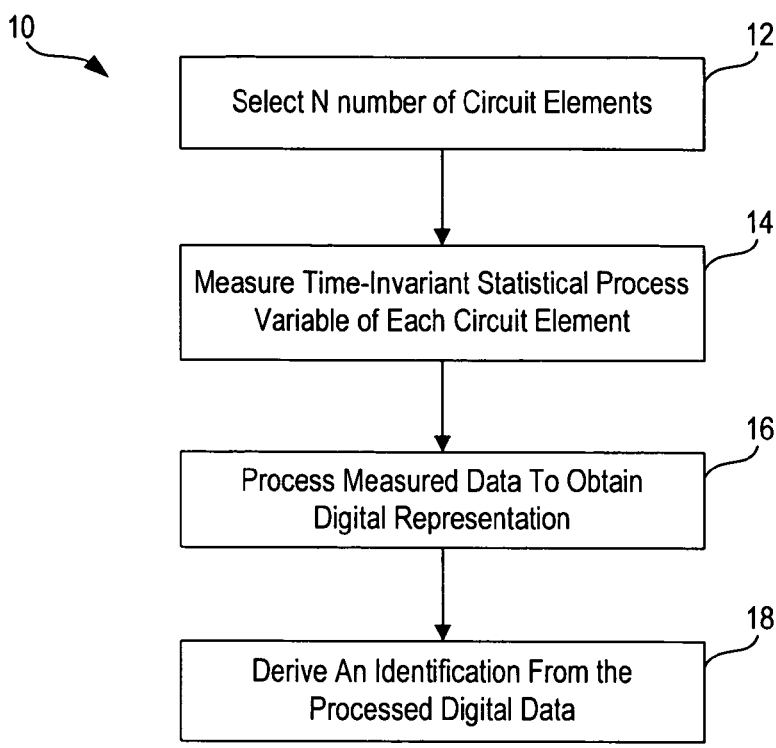
FIG. 1 is a flow chart illustrating the chip identification method according to one embodiment of the present invention for assigning an identification number to a semiconductor chip.

In accordance with the principles of the present invention, a method for providing identification for a semiconductor chip uses an inherent electrical parameter of the semiconductor chip having a time-invariant statistical process variation as the chip identifier. The electrical parameter, which can be a time-invariant statistical process variable or based on a time-invariant statistical process variable, is measured after the chip is manufactured and the measured data is processed to be used as a unique identification number, such as a serial number, for each semiconductor chip. In some embodiments, the threshold voltage of a transistor or the dark current of a light detecting pixel element is the electrical parameter being measured and processed to derive an identifier for the semiconductor chip. In this manner, each semiconductor chip can be uniquely identified without requiring additional fabrication process steps and without requiring physical alteration to the chip to label the chip.

In the present description, an electrical parameter having a time-invariant statistical process variation or a time-invariant statistical process variable refers to a random variable inherent in the semiconductor chip that has a statistical distribution when the semiconductor chip is manufactured in a given fabrication process. An electrical parameter has a statistical process variation when, despite methods employed to curtail process variations, the fabrication process used to manufacture the chip results in the electrical parameter having values that are statistically distributed over a certain range. The chip identification method of the present invention exploits the random nature of these statistical process variables for use as identification for semiconductor chips.

The chip identification method of the present invention uses an electrical parameter associated with one or more circuit elements that are built on the semiconductor chip. A variety of circuit elements can be used to practice the method of the present invention and the term "circuit element" as used in the present description applies to electrical devices (such as resistors or transistors) and to circuit units built using one or more electrical devices (such as a memory cell or a light detecting pixel element or an amplifier). In practice, any circuit element on the semiconductor chip that has an inherent electrical parameter having a statistical process variation can be used as a source of identification for the semiconductor chip. In some embodiments, the circuit elements used are bipolar transistors, metal-oxide-silicon field effect transistors (MOS transistors), light detecting pixel elements ("pixels"), resistors, capacitors and inductors. In other embodiments, the circuit element can be a memory cell (such as an SRAM cell) where the intrinsic logical value of the memory cell upon power up is the time-invariant statistical process variable used to identify the semiconductor chip in which the memory cell is formed. The circuit element can also be an oscillator where the center frequency of the oscillator, being a function of the inductance and the capacitance of the oscillator circuit, is the time-invariant statistical process variable used to identify the semiconductor chip in which the oscillator is formed. Furthermore, the circuit element can be an amplifier where the gain of the amplifier is the time-invariant statistical process variable used to identify the semiconductor chip in which the amplifier is formed.

The circuit element used in the chip identification method of the present invention can be a dedicated circuit element or a non-dedicated circuit element. In one embodiment, the method of the present invention is practiced by providing a dedicated set of circuit elements that have no function other than to provide an identifier for the semiconductor chip. The provision of dedicated circuit elements in the semiconductor chip for the chip identification method of the present invention does not increase the processing complexity of the semiconductor chip as the circuit elements can be manufactured using the same fabrication process steps used to manufacture the semiconductor chip. In an alternate embodiment, the method of the present invention is practiced by using circuit elements that are built in the semiconductor chip for performing chip-specific functions. In this case, no additional circuit structures need to be added to the semiconductor chip for implementing the chip identification method of the present invention.

Depending on the circuit elements selected, the electrical parameter having time-invariant statistical process variation (the time-invariant statistical process variable) that is measured can include a variety of parametric values that are indicative of the electrical characteristics of the circuit elements. In some cases, the electrical parameter can be the time-invariant statistical process variable itself, such as a voltage or a current value. In other cases, the electrical parameter can be a parameter based on or derived from one or more time-invariant statistical process variables, such as a natural logical state of a circuit element or the gain of a circuit element.

Thus, in some embodiments, the time-invariant statistical process variables used for the chip identifier include the threshold voltage of a MOS, the base-to-emitter voltage ($V_{BE}$) or the gain β of a bipolar transistor, the drain current of a MOS transistor, and the collector current of a bipolar transistor. Alternately, the resistance value of a resistor at a given excitation, the capacitance value of a capacitor at a given excitation and the inductance value of an inductor at a given excitation can also be used. In another embodiment, the gain of an amplifier is used as the electrical parameter for identification where the gain is a function of one or more time-invariant statistical process variables of the amplifier circuit.

In other embodiments, the center frequency of an oscillator is used as the electrical parameter where the center frequency has a value that is based on variables having time-invariant statistical process variations. For example, in an LC oscillator, the center frequency is defined as $$\frac{1}{\sqrt{LC}},$$

where the inductance and the capacitance values of the oscillator are the variables having time-invariant statistical process variations. Other oscillators, such as an RC oscillator or an oscillator formed from a delay chain, can have a center frequency defined by other parametric values, as is well known in the art.

When the circuit element is a light detecting pixel element (a pixel) in a sensor array formed on an image sensor chip, the dark current of the pixel in the sensor array can be used as the electrical parameter. Dark current generally relates to the leakage current from the photodiodes or photo-transistors that are used as the light detecting elements in the image sensor. Dark current is generally measured when the pixel is shadowed from incident light. It is well known that dark current of a pixel is a random variable having a statistical distribution as a result of the fabrication process producing the image sensor chip. FIG. 5 illustrates pixel patterns for two image sensors for illustrating the random nature of the dark current values. Referring to FIG. 5, the dark current values for a 10×10 array of pixels within each image sensor are compared against a reference value, such as an average dark current value. Dark current values for pixels that are below the reference value are indicated as black pixels while dark current values for pixels that are above the reference value are indicated as white pixels. As can be observed from FIG. 5, because of the statistical distribution nature of the dark current values, the pixel pattern for image sensor A is different from the pixel pattern of image sensor B and each pixel pattern can serve as a fingerprint for identifying the image sensor chip.

In almost all fabrication processes, measures are taken to minimize the amount of dark current generated by each pixel and to limit the dark current values to a tight distribution. However, the values of the dark current for an array of pixels will still have a statistical variation. Furthermore, some pixels may exhibit large leakage current due to process defects that may or may not impact the functionality of the pixels. Thus, the values of the dark current from an array of pixels may include values that fall within a tight statistical distribution and values ("outliers") that deviate greatly from the expected statistical distribution. The outliers constitute large leakage values, which can be used advantageously as the chip identifier. For instance, N number of the highest dark current values can be digitized to form the chip identifier. Alternately, the locations of these outliers can also be used advantageously as the chip identifier, as will be explained in more detail below.

In one embodiment, the relative value of the dark current of a selected number of pixels in an image sensor is used as the chip identifier. That is, in a given set of pixels, the dark current values of the pixels can be measured and compared. The relative dark current values, that is, whether the dark current value of one pixel is greater or less than that of the next pixel, are serialized as the chip identifier. Each pixel can be compared with a neighboring pixel or the pixels can be randomly selected from the image sensor array and assigned an order. The single-bit comparison results of the given set of pixels can be serialized to form a serial digital value as the chip identifier. In this manner, the relative measurement values, as opposed to the absolute measurement values, are used to identify the semiconductor chips.

Furthermore, a sensor array formed on an image sensor chip will typically include a certain number of defective pixels. The locations of the defective pixels have a statistical distribution so that no two image sensor chips will have the same defective pixel pattern unless there is a systematic fabrication process defect. Thus, the defective pixel locations of an image sensor chip can be used as the statistical process variable for identifying the chip.

Finally, when the circuit element is a memory cell, such as an SRAM cell, the intrinsic logical value of the memory cell can be used as the electrical parameter for chip identification. Specifically, a balanced memory cell will settle to either a logical "1" value or a logical "0" value when the memory cell is powered up before any operation is performed to set or reset the values of the memory cell. The value of the balanced memory cell upon power-up is referred herein as the intrinsic logical value of the memory cell and is a time-invariant statistical process variable. That is, a given memory cell that is balanced will always settle to the same intrinsic logical value upon power-up and a group of balanced memory cells will settle to a pattern of intrinsic logical values as a result of statistical variation. This result can be explained using the example of an SRAM memory cell including two back-to-back connected inverters as the memory storage element. Due to statistical process variations, one of the two back-to-back connected inverters will end up having a higher threshold voltage than the other. The disparity of the threshold voltages of the two back-to-back connected inverters will cause the memory cell to settle to either a logical "1" or a logical "0" upon power up. Other memory cells having a balanced design will have similar characteristics causing the memory cell to settle to the same logical state upon power-up. Thus, each semiconductor chip including an array of memory cells will have a pattern of intrinsic logical values upon power up and the pattern will be different on a different chip due to statistical process variations. The statistically dependent pattern of intrinsic logical values can be read for use as a chip identifier.

While the above descriptions provide several examples of electrical parameters and circuit elements that can be used to practice the method of the present invention, the method of the present invention can be practiced using any other observable physical parameters measured from any other circuit elements as long as the physical parameters include a component that has a time-invariant statistical process variation. The description above is illustrative only and is not intended to be limiting.

The chip identification method of the present invention generates an identifier for a semiconductor chip by measuring the electrical parameters of one or more circuit elements. The uniqueness and reliability of identification is increased when electrical parameters from a large number of circuit elements are used. Specifically, the probability that two chip identifiers derived using the chip identification method of the present invention are the same can be made vanishingly small by using measured values from a large number of circuit elements or using a large number of electrical parameters for each circuit element or both.

FIG. 1 is a flow chart illustrating the chip identification method according to one embodiment of the present invention for assigning an identifier to a semiconductor chip. Referring to FIG. 1, chip identification method 10 operates by selecting N number of circuit elements from the semiconductor chip (step 12). As discussed above, the circuit elements can be dedicated for use in the chip identification method or they can have chip-specific functions in the chip other than for use in chip identification. N can be one or more and is typically a number larger than one to increase the uniqueness and robustness of the identification. Typically, the N numbers of circuit elements are of the same type but can be different type of circuit elements when desired.

Next, an electrical parameter inherent in the selected circuit element and having a time-invariant statistical process variation is selected. The value of the electrical parameter of each circuit element is measured to generate a set of measured data (step 14). Then the measured data is processed (step 16). The processing step can be carried out in a variety of ways to generate a digital representation of the measured data. An identification number for the semiconductor chip can then be derived from the processed digital data (step 18).

In one embodiment, the measured electrical parameter for each circuit element is compared against a reference value and a logical "1" or a logical "0" is assigned for each measured parameter that is high or lower than the reference value. As a result, a string of 1's and 0's associated with each circuit element is generated by the processing step. For example, when the circuit elements are MOS transistors and the electrical parameter of interest is the threshold voltage, the threshold voltage can be compared with an expected statistical mean threshold voltage value. MOS transistors having a threshold voltage greater than the mean value will be assigned a value of "1" while transistors having a threshold voltage less than the mean value will be assigned a value of "0". As a result, a string of 1's and 0's is formed by comparing the threshold voltages of the N number of MOS transistors to the mean value. An identification number for the semiconductor chip can then be derived from the processed digital data (step 18). For instance, the string of 1's and 0's can be combined and serialized into a bit string to use as the identification number.

For example, when 64 MOS transistors are selected as the circuit elements, the threshold voltage of the 64 MOS transistors can be compared against a reference value and a logical values of "1" or "0" is assigned depending on whether the threshold voltage of each MOS transistor is higher or lower than the reference value. As a result, 64 bits of 1's and 0's are obtained which can be serialized to form a 64 bit serial number for the chip.

In another embodiment, the measured electrical parameter for each circuit element is digitized to a k-bit value (step 16). For instance, the threshold voltage or the drain current of an MOS transistor can be digitized to a 4-bit value. Then, the k-bit value for each circuit element can be combined serially to form a string of bits for use as the identification number for the semiconductor chip (step 18).

In yet another embodiment, the circuit element can be a light detecting pixel element ("a pixel") and the electrical parameter can be the dark current value associated with the pixel. The N number of circuit elements can be selected as any N pixels from an array of pixels. Alternately, the N number of circuit elements can be selected as the N pixels having the largest dark current values in the array of pixels. The dark current values can be digitized to k-bit and the digital values combined serially to form a string of bits for use as the identification number for the semiconductor chip. Alternately, processing of the measured dark current values can include obtaining the array locations of the N pixels having the largest dark current values. The array locations can then be serialized to use as the identification number. In other words, the array locations of the N most leaky pixel can be used as the chip identifier.

In another embodiment, the relative dark current values for N pixels are used as the chip identifier. The N pixels can be assigned a given order and the dark current value of each pixel is compared against the next pixel. A first logical value is assigned when the dark current value for the current pixel is greater than the next pixel and a second logical value is assigned when the dark current value for the current pixel is less than the next pixel. The comparison results of the N pixels, indicating the relative dark current values of the N pixels, can be serialized and used as the chip identifier.

In yet another embodiment, the circuit element can be a light detecting pixel element (a pixel) and the electrical parameter can be the functional state of the pixel. That is, an image sensor can be tested and the defective pixels in the array of pixel elements are identified. The locations of the N defective pixels are used as the chip identifier of the semiconductor chip.

Finally, in another embodiment, the circuit element is a balanced memory cell and the electrical parameter is the intrinsic logical value of the memory cell. Upon power-up of the semiconductor chip, the data values of N number of memory cells are read out of the memory in the semiconductor chip. The data values can then be serialized to use as a chip identifier. Alternately, the entire memory array can be read out and a subset of N number of bits is used to form the chip identifier of course, in some embodiments, the entire array can be used to form the chip identifier. This is useful when the memory array is a small array, such as a 64-bit memory array. Basically, the data pattern of the memory in the semiconductor chip upon power-up is used as the chip identifier. Because the data pattern has a statistical process variation, the data pattern associated with one semiconductor chip will be different from the data pattern associated with another semiconductor chip.

The chip identification method of the present invention operates to provide an identification number for a semiconductor chip. The use of such an identification number is numerous and is not within the scope of the method of the present invention. A few exemplary applications of chip identification will be discussed below for illustrative purposes.

Figure 2:
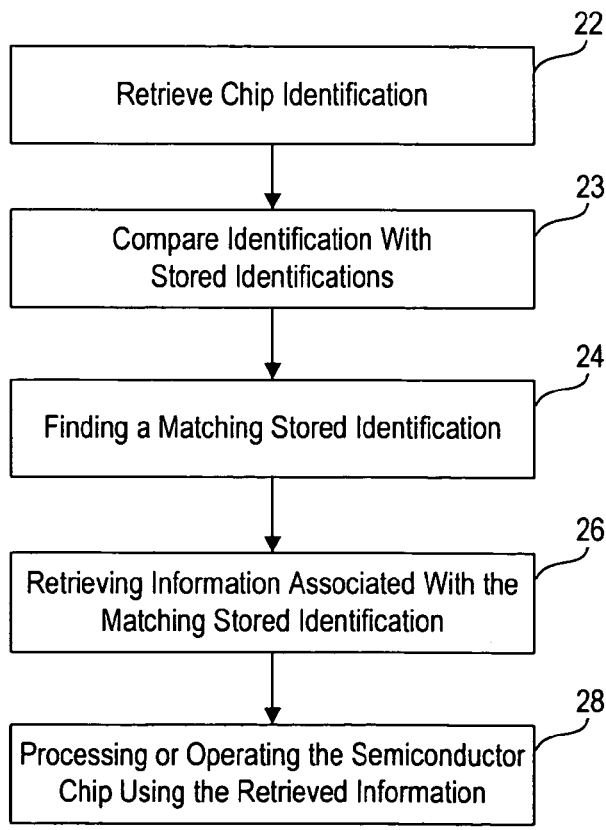
FIG. 2 is a flow chart illustrating a look-up routine for chip identification.

FIG. 2 is a flow chart illustrating a look-up routine for chip identification. Referring to FIG. 2, at step 22, the identification number from the semiconductor chip is retrieved. The retrieval may require the user to place the semiconductor chip in a certain state and operating conditions, such as by the application of a certain excitation voltage or a certain excitation current or by placing the semiconductor chip at a certain temperature. Then, the electrical parameters from the N-selected circuit elements are read out and processed in the same manner as shown in method 10 to obtain the identification number for the semiconductor chip.

Then, the identification number is compared against a list of stored identifiers (step 23). A matching stored identification number is found (step 24) and information associated with the matching stored identification number is retrieved (step 26). The information can then be used to process the semiconductor chip or to operate the semiconductor chip in the desired fashion (step 28).

For example, the stored information can contain repair data for the semiconductor chip. The stored information can also contain characterization data for use in calibrating the electronics system in which the semiconductor chip is incorporated.

In other applications, the identifiers can be used by the electronics system to enable (or disable as appropriate) certain features in the software associated with the electronics system in which the semiconductor chip is installed. For example, a microprocessor chip could be identified as licensed to run a particular operating system or application program.

The chip identification method of the present invention has particular advantages when applied for use in the calibration of image sensor chip. When an image sensor chip is incorporated in an electronic system such as a digital camera, the image sensor chip often needs to be calibrated. The calibration can include identifying the defect pixel locations of the image sensor chip or storing the dark image of the image sensor chip in the camera system, or temperature testing the chip to obtain characterization data. Currently, the calibration is often performed by the camera. manufacturer during camera assembly. It is desirable for the image sensors to be calibrated at the chip manufacturing stage and the calibration data to be provided to the camera manufacturer. However, a cost effective means of associating a set of calibration data with each image sensor is up to now not available. The use of conventional chip identification methods is not feasible as the conventional methods require additional steps to physically mark each image sensor chip, which can be prohibitively costly.

When the chip identification method of the present invention is used, each image sensor chip can be uniquely identified using an electrical parameter inherent in the image sensor chip. Thus, no additional processing steps are required to assign an identification number to each chip. Then, the calibration data, such as the dead pixel locations or the dark image, of each image sensor chip can be stored and associated with the identification number of each image sensor. For instance, the information can be stored in a database accessible through a website on the Internet. Then, during camera assembly, the identification number of an image sensor chip is retrieved from the image sensor chip and used to obtain the stored calibration data associated with the image sensor chip, such as through assessing the relevant website on the Internet.

FIG. 3 illustrates a chip identification method for an image sensor chip according to one embodiment of the present invention. Chip identification method 30 is useful for eliminating the need for calibration of the image sensor chip at camera assembly stage. Referring to FIG. 3, at step 32, the dark current values for M pixels of the image sensor array in the image sensor chip are measured. In one embodiment, the dark current values for all of the pixels in the image sensor array are measured. Then, N pixels having the highest dark current values are selected (step 33). In one embodiment, N is a number between 10 to 20. Then, the pixel locations of the N pixels are obtained (step 34) and the location values are serialized to form an identification number or a serial number for the image sensor chip (step 35). The calibration data for the image sensor chip is obtained (step 36) either before or after the identification number is formed. The calibration data can include defective pixel locations, dark image and other characterization data for the image sensor chip at different operating conditions. The calibration data for the image sensor chip is then stored and indexed by the identification number (step 37).

FIG. 4 illustrates the steps that can be taken at the camera assembly stage for retrieving the stored calibration data associated with an image sensor chip. The method shown in FIG. 4 is illustrative only. Referring to FIG. 4, at the camera assembly stage, the image sensor chip is placed under a predefined bias condition and the identification number for the chip is retrieved (step 42). The retrieved identification number is used to look up a list of stored identifiers (step 44). A closest match method—for example using methods known as so called "fuzzy logic"—can be used to find the matching identifier. When a match is found, the calibration data associated with the matching identifier is retrieved (step 46). Then, the calibration data can be used in the camera assembly process (step 48) and the image sensor chip can be incorporated in the camera system without requiring the camera manufacturer to perform further calibration or temperature testing.

In the chip identification method of the present invention, using a large number of circuit elements, thereby providing a large number of measured data values for use in deriving the chip identifier, can increase the accuracy and repeatability of the chip identifier. For example, when the electrical parameter is represented by a single bit and when N numbers of circuit elements are used, the odds of two chips having an identical serial number is $$\frac{1}{2^N}.$$

Thus, when a large value for N is used, a robust chip identifier can be generated. There is a possibility that measurement error might produce a slightly different serial number on repeated measurements. Measurement errors can be accounted for by using additional bits in the identifier and by using a "closest match" technique when the identifier is being looked up from a list of identifiers. Thus, by making N large, the possibility of an incorrect match can be made very small.

In the above description, a single electrical parameter is used to form the chip identifier. In other embodiments, two or more electrical parameters can be used to form the chip identifier. That is, a chip identifier can be derived from one or more electrical parameter measured from one or more circuit elements. For example, both the base-to-emitter voltage and the gain of a string of bipolar transistors can be used to form a chip identifier for a semiconductor chip.

When the chip identifier contains a large number of bits, the chip identification method of the present invention can include a compression step whereby the identification number is compressed using any known numerical compression algorithms, such as Linear Feedback Shift Register performing polynomial division. Compressing the identification number facilitates storage of a large number of identifiers. As long as the same compression algorithm is applied when the identifier is retrieved from the semiconductor chip or retrieved from a list of stored identifiers, the proper matching of identification number can be carried out as described above.

The above detailed descriptions are provided to illustrate specific embodiments of the present invention and are not intended to be limiting. Numerous modifications and variations within the scope of the present invention are possible. The present invention is defined by the appended claims.

We claim:

1. A method for providing an identifier for a semiconductor chip after the manufacture of the semiconductor chip using a fabrication process, the method comprising:

selecting one or more circuit elements formed on the semiconductor chip, each of the circuit elements having an electrical parameter that has a time-invariant statistical process variation;

measuring data values of the electrical parameter of the one or more circuit elements;

processing the data values; and deriving the identifier for the semiconductor chip using the processed data values, wherein the identifier identifies the semiconductor chip from other semiconductor chips manufactured using the fabrication process.

2. The method of claim 1, wherein selecting one or more circuit elements formed on the semiconductor chip comprises:

selecting one or more circuit elements from the group of bipolar transistors, MOS transistors, light detecting pixel elements, memory cells, resistors, capacitors and inductors.

3. The method of claim 1, wherein selecting one or more circuit elements formed on the semiconductor chip comprises selecting one or more resistors, the resistors having resistance values as the electrical parameter that has a time-invariant statistical process variation; and wherein measuring data values associated with the electrical parameter of the one or more circuit elements comprises measuring the resistance values of the one or more resistors.

4. The method of claim 1, wherein selecting one or more circuit elements formed on the semiconductor chip comprises selecting one or more capacitors, the capacitors having capacitance values as the electrical parameter that has a time-invariant statistical process variation; and wherein measuring data values associated with the electrical parameter of the one or more circuit elements comprises measuring the capacitance values of the one or more capacitors.

5. The method of claim 1, wherein selecting one or more circuit elements formed on the semiconductor chip comprises selecting one or more inductors, the inductors having inductance values as the electrical parameter that has a time-invariant statistical process variation; and wherein measuring data values associated with the electrical parameter of the one or more circuit elements comprises measuring the inductance values of the one or more inductors.

6. The method of claim 1, wherein selecting one or more circuit elements formed on the semiconductor chip comprises selecting one or more oscillators, the oscillators having center frequency values as the electrical parameter that has a time-invariant statistical process variation; and wherein measuring data values associated with the electrical parameter of the one or more circuit elements comprises measuring the center frequency values of the one or more oscillators.

7. The method of claim 1, wherein selecting one or more circuit elements formed on the semiconductor chip comprises selecting one or more amplifiers, the amplifiers having gain values as the electrical parameter that has a time-invariant statistical process variation; and wherein measuring data values associated with the electrical parameter of the one or more circuit elements comprises measuring the gain values of the one or more amplifiers.

8. The method of claim 1, wherein selecting one or more circuit elements formed on the semiconductor chip comprises selecting one or more bipolar transistors, the bipolar transistors having base-to-emitter voltage values, β gain values and collector current values as the electrical parameters that have time-invariant statistical process variations; and wherein measuring data values associated with the electrical parameter of the one or more circuit elements comprises measuring the base-to-emitter voltage values or the β gain values or the collector current values of the one or more bipolar transistors.

9. The method of claim 1, wherein selecting one or more circuit elements formed on the semiconductor chip comprises selecting one or more MOS transistors, the MOS transistors having threshold voltage values and drain current values as the electrical parameters that have time-invariant statistical process variations; and wherein measuring data values associated with the electrical parameter of the one or more circuit elements comprises measuring the threshold voltage values or the drain current values of the one or more MOS transistors.

10. The method of claim 1, wherein processing the data values comprises:
comparing the data value associated with each circuit element to a reference value;
assigning a first logical value when the data value is greater than the reference value;
assigning a second logical value when the data value is less than the reference value; and
providing a set of logical values associated with the one or more circuit elements as processed data values.

11. The method of claim 10, wherein deriving the identifier for the semiconductor chip using the processed data values comprises:
serializing the set of logical values associated with the one or more circuit elements; and
providing the serial logical values as the identifier.

12. The method of claim 1, wherein processing the data values comprises:
digitizing each of the data values to a k-bit digital value; and
providing a set of k-bit digital values associated with the one or more circuit elements as processed data values.

13. The method of claim 12, wherein deriving the identifier for the semiconductor chip using the processed data values comprises:
serializing the set of k-bit digital values associated with the one or more circuit elements; and
providing the serial digital values as the identifier.

14. The method of claim 1, wherein selecting one or more circuit elements formed on the semiconductor chip comprises selecting one or more light detecting pixel elements from an array of light detecting pixel elements, the light detecting pixel elements having dark current values as the electrical parameter that has time-invariant statistical process variations; and wherein measuring data values associated with the electrical parameter of the one or more circuit elements comprises measuring the dark current values of the one or more light detecting pixel elements.

15. The method of claim 14, wherein processing the data values comprises digitizing the measured dark current values of the one or more light detecting pixel elements into a set of k-bit digital values; and wherein deriving the identifier for the semiconductor chip using the processed data values comprises serializing the set of k-bit digital values associated with the one or more circuit elements and providing the serial digital values as the identifier.

16. The method of claim 14, wherein processing the data values comprises selecting P light detecting pixel elements having the P highest dark current values and digitizing the measured dark current values of the P light detecting pixel elements into a set of k-bit digital values; and wherein deriving the identifier for the semiconductor chip using the processed data values comprises serializing the set of k-bit digital values associated with the one or more circuit elements and providing the serial digital values as the identifier.

17. The method of claim 14, wherein processing the data values comprises selecting P light detecting pixel elements having the P highest dark current values and obtaining the locations of the P light detecting pixel elements in the array of light detecting pixel elements; and wherein deriving the identifier for the semiconductor chip using the processed data values comprises serializing the locations of the P light detecting pixel elements and providing the serial location values as the identifier.

18. The method of claim 14, wherein processing the data values comprises selecting and ordering P light detecting pixel elements, comparing the dark current value of each light detecting pixel element with the dark current value of the next light detecting pixel element; and wherein deriving the identifier for the semiconductor chip using the processed data values comprises serializing the comparison result of the P light detecting pixel elements and providing the serial digital values as the identifier.

19. The method of claim 1, wherein selecting one or more circuit elements formed on the semiconductor chip comprises selecting one or more balanced memory cells of a memory array, the balanced memory cells having intrinsic logical values upon power-up as the electrical parameters that have time-invariant statistical process variations; and wherein measuring data values associated with the electrical parameter of the one or more circuit elements comprises reading the intrinsic logical values of the one or more balanced memory cells.

20. The method of claim 19, wherein processing the data values comprises providing the intrinsic logical values of the one or more memory cells read out of the memory array as processed data values; and wherein deriving the identifier for the semiconductor chip using the processed data values comprises serializing the intrinsic logical values associated with the one or more memory cells and providing the serial intrinsic logical values as the identifier.

21. A method for providing an identifier for an image sensor semiconductor chip including an array of pixels after the manufacture of the image sensor semiconductor chip using a fabrication process, the method comprising:
measuring dark current values of each pixel in the array of pixels;
selecting N pixels from the array of pixels having the N highest dark current values;
obtaining the locations of the N pixels in the array of pixels;
serializing the location values of the N pixels into a bit string; and
providing the bit string as the identifier for the image sensor semiconductor chip.

22. The method of claim 21, wherein measuring dark current values of each pixel in the array of pixels comprises measuring dark current values of M pixels in the array of pixels, wherein M is greater than N.

23. A method for providing an identifier for an image sensor semiconductor chip including an array of pixels after the manufacture of the image sensor semiconductor chip using a fabrication process, the method comprising:

measuring dark current values of each pixel in the array of pixels;

selecting N pixels from the array of pixels having the N highest dark current values;

digitizing the dark current values of the N pixels into a set of k-bit digital values;

serializing the k-bit digital values of the N pixels into a bit string; and providing the bit string as the identifier for the image sensor semiconductor chip.

24. The method of claim 23, wherein measuring dark current values of each pixel in the array of pixels comprises measuring dark current values of M pixels in the array of pixels, wherein M is greater than N.

25. A method for providing an identifier for an image sensor semiconductor chip including an array of pixels after the manufacture of the image sensor semiconductor chip using a fabrication process, the method comprising:

determining pixels that are defective in the array of pixels;

selecting N pixels from the defective pixels;

obtaining the locations of the N pixels in the array of pixels;

serializing the location values of the N pixels into a bit string; and providing the bit string as the identifier for the image sensor semiconductor chip.

26. A method for providing an identifier for a semiconductor chip including an array of balanced memory cells after the manufacture of the semiconductor chip using a fabrication process, the method comprising:

powering up the semiconductor chip;

reading logical values from N balanced memory cells in the array of memory cells, the logical values being the intrinsic logical values of the array of balanced memory cells;

serializing the logical values read from the N balanced memory cells into a bit string; and providing the bit string as the identifier for the semiconductor chip.

* * * * *